United States Patent [19]

Faith

[11] Patent Number: 4,524,331

[45] Date of Patent: Jun. 18, 1985

[54] HIGH INPUT IMPEDANCE AMPLIFIER CIRCUIT

[75] Inventor: Richard W. Faith, Hacienda Heights, Calif.

[73] Assignee: Orion Industries, Inc., Compton, Calif.

[21] Appl. No.: 417,025

[22] Filed: Sep. 13, 1982

[51] Int. Cl.$^3$ ............................................... H03F 1/38
[52] U.S. Cl. ................................. 330/292; 330/100; 330/112; 330/156; 330/311
[58] Field of Search ................................... 330/98–100, 330/152, 153, 156, 112, 291, 292, 310, 311

[56] References Cited

U.S. PATENT DOCUMENTS

| | | | |
|---|---|---|---|
| 2,942,200 | 6/1960 | Hanel et al. | 330/290 |
| 3,379,987 | 4/1968 | Volkers | 330/156 X |
| 3,720,879 | 3/1973 | Reitmeyer, Jr. | 330/291 |
| 3,750,041 | 7/1973 | Gay | 330/110 X |
| 4,042,887 | 8/1977 | Mead et al. | 330/53 |
| 4,218,659 | 8/1980 | Arai | 330/6 |

OTHER PUBLICATIONS

Aghion, "Use of Positive Feedback to Enhance the Open-Coop Gain of Fast Operational Amplifiers", Alta Frequenza, vol. XLVII, No. 11, Nov. 1978, pp. 485E-815-18.

Electronic Design, "Bootstrapping Helps Transistors Approach FET Performances", Dec. 6, 1963, p. 66.

Primary Examiner—James B. Mullins
Attorney, Agent, or Firm—Roylance, Abrams, Berdo & Goodman

[57] ABSTRACT

A three-stage amplifier circuit specially configured to provide a high input impedance. An initial emitter follower transistor stage amplifies the current level of an ac input signal to produce a first intermediate signal, a common-base transistor stage amplifies the voltage level of the first intermediate signal to produce a second intermediate signal, and a final emitter-follower transistor stage amplifies the current level of the second intermediate signal to produce an output signal in phase with the input signal. A feedback circuit feeds back the output signal to the input of the common-base transistor stage, to supplement the first intermediate signal input. This effectively increases the input impedance of the common-base transistor stage and, likewise, the initial emitter follower transistor stage, whereby the amplifier circuit can be used to amplify signals produced by high impedance sources.

1 Claim, 2 Drawing Figures

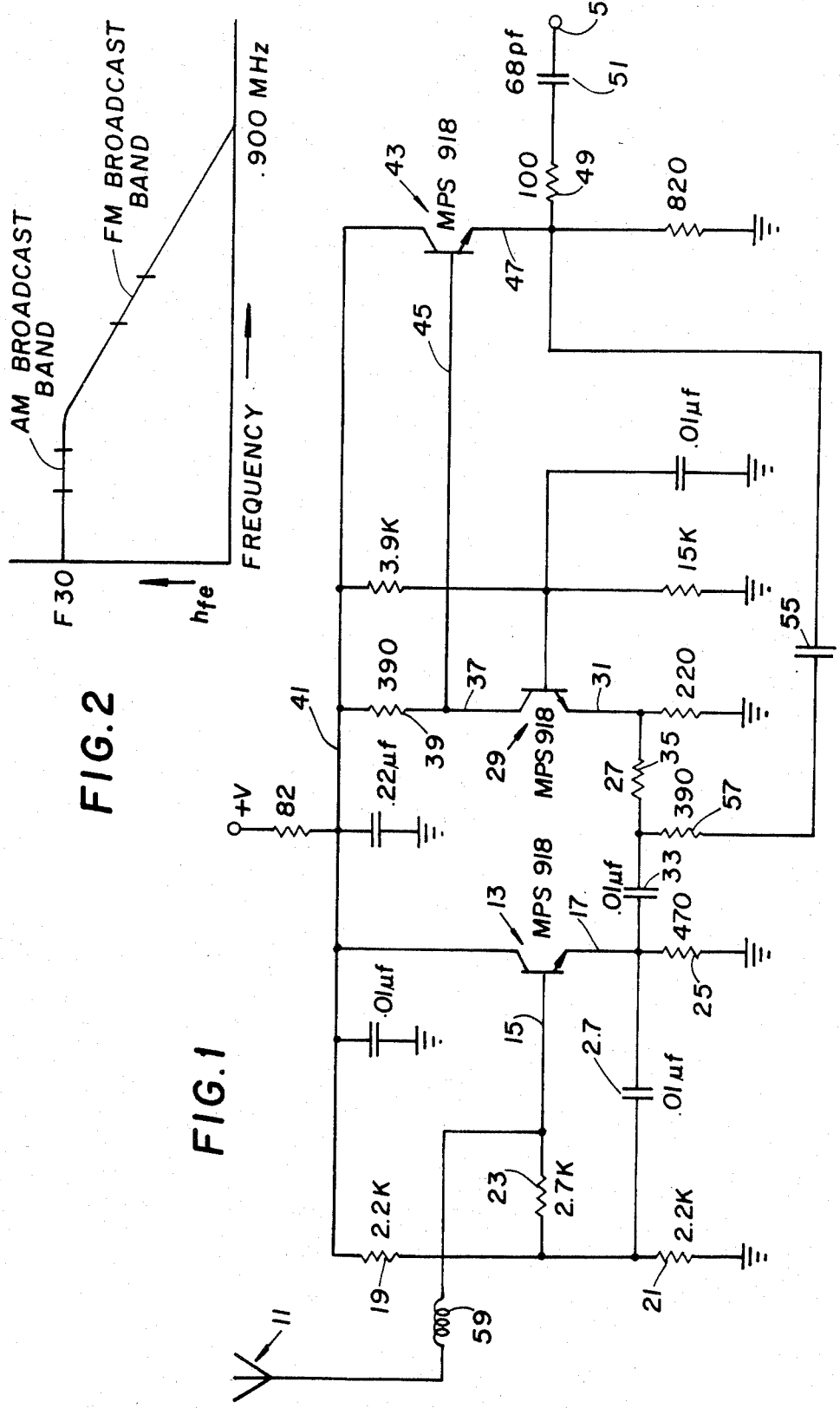

HIGH INPUT IMPEDANCE AMPLIFIER CIRCUIT

BACKGROUND OF THE INVENTION

This invention relates generally to amplifier circuits, and, more particularly, to wideband amplifier circuits that are specially configured to provide a high input impedance.

Wideband amplifier circuits are commonly used to amplify radio signals, including both am and fm broadcast signals, generated by a high impedance source such as an antenna. In the past, such amplifier circuits have frequently included reactive components specially tuned to the specific frequency bands desired, e.g., 540 to 1600 kHz for the am broadcast band and 88 to 108 MHz for the fm broadcast band. Such circuits have not proven to be entirely satisfactory when placed in mass production, however, because adjustments must ordinarily be made to the tuned circuits, thus adding to the labor costs.

Wideband amplifier circuits that don't include such tuned circuits are not believed to be in general use. This is possibly because non-tuned amplifier circuits were not previously available having an input impedance sufficiently high to amplify the am band signals, where the antenna impedance is relatively high, while at the same time having a sufficiently wide frequency response to also amplify the fm band signals.

It should therefore be appreciated that there is a need for an amplifier circuit having a relatively high input impedance at the am broadcast frequency band, while simultaneously having a frequency response extending at least to the fm broadcast frequency band. The present invention fulfills this need.

SUMMARY OF THE INVENTION

The present invention is embodied in a wideband amplifier circuit having a high input impedance, making it suitable for use in amplifying signals produced by a relatively high impedance source. The amplifier circuit includes voltage amplification means for amplifying the voltage level of an input signal to produce an intermediate signal, and current amplification means for amplifying the current level of the intermediate signal to produce an output signal substantially in phase with the input signal. The voltage amplification means, by itself, has a relatively low input impedance. In accordance with the invention, the amplifier circuit further includes regenerative feedback means for coupling the output signal back to the first amplification means, to supplement the input signal. The amount of feedback is selected such that the amplifier circuit's input impedance is made to be substantially greater than that of the voltage amplification means. The circuit therefore can be used effectively to amplify signals produced by a relatively high impedance source.

More particularly, the voltage amplification means includes a transistor connected in a common-base configuration, and the current amplification means includes a transistor connected in a common-collector or emitter follower configuration. The input signal is coupled to the emitter terminal of the voltage amplification transistor, and the intermediate signal is produced at the collector terminal of the voltage amplification transistor for coupling to the base terminal of the current amplification transistor. The output signal is then produced at the emitter terminal of the current amplification transistor.

The voltage amplification means further includes an emitter resistor connected between the emitter terminal of its transistor and an input terminal to which the input signal is connected, along with a collector resistor connected between a voltage supply and the collector terminal of its transistor. The regenerative feedback means includes a feedback resistor connected between the emitter terminal of the current amplification transistor and the input terminal of the first amplification means. The collector resistor and the feedback resistor preferably have substantially the same resistance, such that the regenerative feedback approaches unity.

In the preferred embodiment, the amplifier circuit further includes an initial current amplification stage having a transistor connected in a common-collector or emitter follower configuration. It amplifies the current level of the input signal prior to coupling to the voltage amplification means.

Other aspects and advantages of the present invention should become apparent from the following description of the preferred embodiment, taken in conjunction with the accompanying drawings, which illustrate, by way of example, the principles of the invention.

BRIEF DESCRIPTION OF THE DRAWINGS

FIG. 1 is a schematic diagram of a three-stage amplifier circuit embodying the present invention, for amplifying both am band and fm band radio broadcast signals; and FIG. 2 is a graph showing the of the smallsignal current gain, i.e., $h_{fe}$, of each transistor of the amplifier circuit of FIG. 1, over a frequency range spanning both the am and fm broadcast bands.

DESCRIPTION OF THE PREFERRED EMBODIMENT

Referring now to the drawings, and particularly to FIG. 1, there is shown a three-stage amplifier circuit embodying the present invention, for amplifying a wideband input signal generated by an antenna 11. The frequency spectrum of the wideband input signal spans both the am radio broadcast band, i.e., 540 to 1600 kHz, and the fm radio broadcast band, i.e., 88 to 108 MHz.

The amplifier circuit includes three stages of amplification. The first stage includes an npn transistor 13 for amplifying the current level of the input signal, to produce a first intermediate signal. The transistor is connected in an emitter follower or common-collector configuration, with the input signal being coupled directly to its base terminal 15 and the intermediate signal being produced at its emitter terminal 17. A network of resistors 19, 21 and 23 appropriately bias the transistor's base terminal, and a resistor 25 couples the emitter terminal to signal ground.

It is important that the ac input impedance of the first amplification stage be as high as possible, especially at the am frequency band, so as to minimize the loading on the antenna 11. This ac input impedance is roughly equal to the parallel combination of (1) the small-signal current gain, i.e., $h_{fe}$, of the first stage transistor 13 multiplied by the impedance at the transistor's emitter terminal 17, and (2) the effective resistance of the network of biasing resistors 19, 21 and 23.

As a means of increasing the effective resistance of the biasing resistors 19, 21 and 23, the first amplification stage further includes a conventional regenerative feedback circuit, in which a feedback capacitor 27 couples the first intermediate signal, produced at the first transistor's emitter terminal 17, back to the transistor's base terminal 15. Since the first intermediate signal is in phase with the input signal, this feedback is regenerative and effectively reduces the ac current drawn by the biasing resistors. The biasing resistors therefore present a substantially increased ac impedance and minimize the loading on the antenna 11. The value of the feedback capacitor is selected such that its impedance at the lower end of the am frequency band is negligible compared with the resistances of the three biasing resistors.

The amplifier circuit's second amplification stage includes an npn transistor 29 for amplifying the voltage level of the first intermediate signal, to produce a second intermediate signal. The transistor is connected in a common-base configuration, with the first intermediate signal being coupled from the first stage transistor 13 to the emitter terminal 31 of the second stage transistor, via a coupling capacitor 33 and an emitter resistor 35. The second intermediate signal is produced at the second stage transistor's collector terminal 37. A collector resistor 39 is connected between the second stage transistor's collector terminal and a positive supply voltage 41, so the second amplification stage's voltage gain is approximately equal to the ratio of the collector resistor 39 to the emitter resistor 35. In the preferred embodiment, this voltage gain is equal to about 13.

The third amplification stage includes an npn transistor 43 for amplifying the current level of the second intermediate signal, to produce an output signal. The third stage transistor is connected in an emitter follower or common-collector configuration, with the second intermediate signal being coupled from the second stage transistor 29 directly to the base terminal 45 of the third stage transistor. The output signal is produced at the third stage transistor's emitter terminal 47 and is coupled through a series-connected output resistor 49 and output capacitor 51 to an output terminal 53. The resistance of the output resistor is selected to match that of the load (not shown).

As previously mentioned, the amplifier circuit's input impedance is determined not only by the biasing resistors 19, 21 and 23, but also by the impedance at the emitter terminal 17 of the first stage transistor 13. Unfortunately, that terminal is coupled to the emitter terminal 31 of the second stage transistor 29, which is connected in a common-base configuration and which therefore ordinarily has a relatively low ac input impedance.

In accordance with the invention, the relatively low input impedance of the second amplification stage is increased significantly using a regenerative feedback technique in which the output signal produced by the third amplification stage is coupled back through a feedback capacitor 55 and a feedback resistor 57 to the input of the second amplification stage. The feedback signal is in phase with and supplements the first intermediate signal being input to the second stage from the first stage, thereby reducing the ac current drawn by the second stage. The impedance at the emitter terminal 17 of the first stage transistor 13 is therefore increased considerably, and the input impedance of the first amplification stage, which is the load on the antenna 11, is correspondingly increased.

The value for the collector resistor 39 in the second amplification stage is selected such that its bandlimiting interaction with the collector-base capacitance, i.e., $C_{cb}$, of the second stage transistor 29 is relatively low. The second stage therefore retains most of its voltage gain even at frequencies as high as 100 MHz. In the preferred embodiment, the collector resistor has a resistance of 390 ohms and the emitter resistor 35 has a resistance of 27 ohms.

The feedback resistor 57 is preferably selected to have a resistance approximately the same as that of the collector resistor 39. In this way, the feedback signal is divided down in substantially the same ratio as it was originally amplified in the second stage transistor 29. The amplifier circuit incorporates sufficient margin, however, to ensure that the amount of feedback cannot reach unity, which would result in instability.

The feedback capacitor 55 is selected to have a negligible impedance relative to that of the feedback resistor 57 at the frequencies in question, i.e., 540 to 1600 kHz and 88 to 108 MHz. This reduces distortion of the feedback signal and insures that it is substantially in phase with the first intermediate signal.

In the preferred embodiment, the antenna 11 is a 14-inch whip antenna that resonates at about 400 MHz. It has an impedance of about 30 ohms at that frequency and an impedance like that of a capacitor, at lower frequencies. To reduce the impedance of the antenna in the fm broadcast band, i.e., 88 to 108 MHz, the amplifier circuit further includes an inductor 59 in series with the antenna. The antenna/inductor combination then resonates at about 100 MHz, at which frequency the input impedance of the first amplification stage is about 250 ohms. The antenna/inductor combination is therefore highly damped, and the amplifier circuit provides broadband amplification of the input signal. The inductor has little effect on am band signals generated by the antenna.

The regenerative feedback effected by the feedback resistor 57 and feedback capacitor 55 is most important in the am frequency band, where the impedance of the antenna 11 is relatively high, exceeding 1000 ohms. As shown in FIG. 2, the small-signal current gain of the circuit's transistors 13, 29 and 43 is relatively high in this band, so the regenerative feedback is effective in minimizing the circuit's impedance. The small-signal current gain drops off for frequencies in the fm band, but since the antenna's impedance similarly drops off, it is not critical that the amplifier circuit's input impedance be particularly high.

It should be appreciated from the foregoing description that the present invention provides an improved amplifier circuit for amplifying a signal generated by a relatively high impedance source, over a broad frequency range spanning both the am and fm broadcast frequency bands. The circuit includes a voltage amplification stage, followed by a separate current amplification stage, with regenerative feedback from the output of the current amplification stage to the input of the voltage amplification stage, to substantially increase the latter's input impedance.

Although the invention has been described in detail with reference to the presently preferred embodiment, it should be understood by those of ordinary skill in the art that various modifications can be made without departing from the invention. Accordingly, the invention is limited only by the appending claims.

I claim:

1. A three-stage amplifier with a voltage supply for amplifying a single ac input signal received by a small radio-frequency antennae producing a single ac input signal, comprising:
- first current amplification means for amplifying the current level of said single ac input signal to produce a first intermediate signal, including a first transistor connected in a common-collector configuration, said first current amplification means having low output impedance and a high input impedance;
- single-stage feedback means coupling said first intermediate signal back to said single ac input signal, to supplement said single ac input signal thereby increasing the input impedance of said first current amplification means;
- voltage amplification means including a second transistor connected in a common-base configuration, for amplifying said first intermediate signal producing a second intermediate signal, said first intermediate signal being coupled to the emitter terminal of said second transistor, an emitter resistor connected between said first intermediate signal and the emitter terminal of said second transistor, and a collector resistor connected between said voltage supply and the collector terminal of said second transistor, said voltage amplification means having a low input impedance; and a high output impedance;
- a second current amplification means for amplifying the current level of said second intermediate signal to produce an output signal substantially in phase with said input signal including a third transistor connected in a common-collector configuration, said second intermediate signal being coupled from said voltage amplification means to the base terminal of said third transistor, said second current amplification means having a high input impedance; and
- regenerative feedback means including a feedback resistor connected between the emitter terminal of said first transistor and the emitter terminal of said third transistor and, the resistance of said collector resistor being equal to the resistance of said feedback resistor, whereby said low output impedance of said first current amplification means is matched with said low input impedance of said voltage amplification means and the high output impedance of said voltage amplification means is matched with the high input impedance of the second current amplification means, thereby reducing losses due to mismatched impedances, and in combination with said regenerative feedback means and said single-stage feedback means, maximizes input impedance of said amplifier circuit.

* * * * *